United States Patent

Bodano

(10) Patent No.: US 9,970,980 B2
(45) Date of Patent: May 15, 2018

(54) TEST CIRCUIT FOR STRESS LEAKAGE MEASUREMENTS

(71) Applicant: Infineon Technologies AG, Neubiberg (DE)

(72) Inventor: Emanuele Bodano, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/248,760

(22) Filed: Aug. 26, 2016

(65) Prior Publication Data

US 2018/0059166 A1    Mar. 1, 2018

(51) Int. Cl.
 *G01R 31/3187*    (2006.01)
 *G01R 31/26*    (2014.01)
 *G01R 31/27*    (2006.01)

(52) U.S. Cl.
 CPC ......... *G01R 31/2621* (2013.01); *G01R 31/27* (2013.01)

(58) Field of Classification Search
 CPC ........ G01R 21/133; G01R 27/14; G06F 13/20
 USPC ............ 324/76.11, 76.61, 76.69, 76.74, 103
 See application file for complete search history.

(56) References Cited

U.S. PATENT DOCUMENTS

| | | | | |
|---|---|---|---|---|
| 6,617,972 B2* | 9/2003 | Takarada | ........... | G08B 21/0484 324/538 |
| 8,779,729 B2* | 7/2014 | Shiraishi | ............ | G01R 31/3606 320/134 |
| 2006/0250188 A1* | 11/2006 | Kaya | ........................ | H03F 3/217 330/277 |
| 2007/0139077 A1 | 6/2007 | Park et al. | | |
| 2012/0098518 A1* | 4/2012 | Unagami | ............. | G01R 22/066 324/74 |
| 2016/0049856 A1* | 2/2016 | Zhang | ................... | H02M 7/217 363/77 |
| 2016/0069946 A1* | 3/2016 | Ikeda | ................. | G01R 31/2621 324/762.09 |

\* cited by examiner

*Primary Examiner* — Giovanni Astacio-Oquendo
(74) *Attorney, Agent, or Firm* — Slater Matsil, LLP

(57) ABSTRACT

In accordance with an embodiment, a circuit includes: a gate drive circuit; an output transistor, and a gate coupled to the gate drive circuit; a normally-on transistor including a load path coupled to the gate drive circuit and to the gate of the output transistor; and a pull-up device, where the output transistor is configured to provide a test leakage current in a test mode when a measurement voltage is applied to a current test node coupled to the gate of the output transistor and a turn-off voltage is applied to the gate of the normally-on transistor; and the gate drive circuit is configured to provide a gate drive voltage to the gate of the output transistor in a nominal operation mode when a voltage of the gate of the normally-on transistor is pulled-up to a voltage of the pull-up node via the pull-up device.

31 Claims, 10 Drawing Sheets

PRIOR ART

PRIOR ART

TEST CIRCUIT FOR STRESS LEAKAGE MEASUREMENTS

TECHNICAL FIELD

The present disclosure relates generally to an electronic device, and more particularly to a test circuit for stress leakage measurements.

BACKGROUND

Electronic devices are pervasive in many applications from computers to automobiles. Generally, electronic devices have a specified life time and are expected to not fail within that time.

Manufacturing defects may cause electronic devices to deviate from expected performance or fail at any point during the electronic device's life time. Electronic devices, therefore, are typically tested prior to shipping them to customers to ensure that the electronic devices perform within the limits set by their specification.

Defects may be categorized as intrinsic defects or extrinsic defects. Extrinsic defects are those that are directly reflected in the performance of the electronic device, and are typically caught during production testing by measuring the electronic device's performance and comparing it against the specification. Devices lost to extrinsic defects are also as infant-mortality. Certain type of manufacturing defects, however, may not manifest itself during initial testing as a normal-use failure, but may cause an application to fail later in the electronic device life. Such defects are known as intrinsic defects, and may be caught we certain types of stress testing. Devices lost to extrinsic defects are also as adult-mortality.

It is often desirable to screen out electronic devices with intrinsic defects prior to shipping them to customers to avoid system failures in applications using such electronic devices.

SUMMARY

In accordance with an embodiment, a circuit includes: a gate drive circuit; an output transistor having a first load path coupled between a supply node and an output node, and a gate coupled to the gate drive circuit; a normally-on transistor including a second load path coupled to the gate drive circuit and to the gate of the output transistor; and a pull-up device coupled between a gate of the normally-on transistor and a pull-up node, where the output transistor is configured to provide a test leakage current in a test mode when a measurement voltage is applied to a current test node coupled to the gate of the output transistor and a turn-off voltage is applied to the gate of the normally-on transistor. The gate drive circuit is configured to provide a gate drive voltage to the gate of the output transistor in a nominal operation mode when a voltage of the gate of the normally-on transistor is pulled-up to a voltage of the pull-up node via the pull-up device.

BRIEF DESCRIPTION OF THE DRAWINGS

For a more complete understanding of the present invention, and the advantages thereof, reference is now made to the following descriptions taken in conjunction with the accompanying drawings, in which:

FIG. 1d shows an alternative implementation of leakage stress test circuitry of the circuit of FIG. 1a;

Figure 1A:
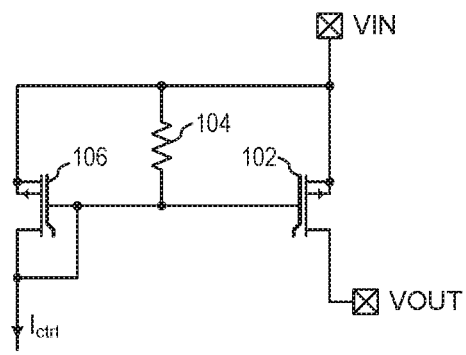
FIG. 1a shows a power MOSFET system in a topology that could be used in a linear voltage regulator.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for leakage stress testing of devices including power metal oxide semiconductor field effect transistors (MOSFETs) in various circuit topologies. Embodiments of the present invention may also be applied to other circuit topologies and other FETs types.

In an embodiment of the present invention, a power MOSFET system is configured to perform a leakage stress test during production testing. The results of the leakage stress test may be used to detect defects in the power MOSFET system, and may be used to screen out defected parts. The power MOSFET system includes a normally-on transistor coupled between a gate drive circuit and a gate of a power MOSFET. During normal operation of the circuit, the normally-on transistor is kept on via the pullup circuit without applying an additional drive signal, according to some embodiments. During testing, a turn-off voltage is applied to the gate of the normally-on transistor in order to isolate the gate of the power MOSFET from the gate drive circuit to allow a measurement of the gate leakage current of the power MOSFET. Some embodiments may not require additional current during normal operation, and during a power down state to keep the power MOSFET off.

A power MOSFET is a type of MOSFET capable of handling significant amounts of power. A power MOSFET may be implemented as a discrete device, or may be integrated with other components into an integrated circuit. Power MOSFETs are typically large devices, often occupying a large portion of the die area. A larger silicon area may be associated with having a higher probability of defects since it is statistically more likely that a defect will be present in a larger area than in a smaller area. Each device, therefore, is typically tested in production, often using automatic test equipment (ATE), to assess the quality of the device and check the device performance against the device specification. Devices below a minimum quality or failing to meet the specification requirements may be categorized as bad devices. On the other hand, devices above the minimum quality and meeting the specification requirements are may be categorized as good devices.

During production testing, extrinsic defects may be detected by testing a device against its specification. Typical tests include on-resistance $R_{DSon}$, and off-resistance $R_{DSoff}$. Intrinsic defects may be detected by applying specific types of stress tests. For example, a typical power MOSFET may exhibit a small amount of leakage current, typically a few nano-amps, when a stress voltage is applied between its gate and its source and drain. In the presence of defects, such as gate oxide defects, however, the leakage current during the leakage stress test may be substantially higher, and may range from a few hundreds of nano-amps to a complete short. Stressing the power MOSFET in this way during production testing, therefore, may allow for the detection and screen-out of defected devices.

FIG. 1a shows power MOSFET 102 in a linear voltage regulator topology that could benefit from leakage stress testing. During normal operation, a gate drive circuit including transistor 106 controls a gate of power MOSFET 102. Polarization current $I_{ctrl}$ flowing through transistor 106 may be mirrored into a current flowing through a load path of power MOSFET 102. Resistor 104 may keep power MOSFET 102 off during a power-down state.

Performing a leakage stress test to power MOSFET 102 includes applying a stress voltage between the gate of power MOSFET 102 and the source and drain of power MOSFET 102, and measuring the current flowing through the gate of power MOSFET 102. The measurement of the leakage current, however, is affected by the presence of resistor 104, which may conduct a current orders of magnitude higher than the leakage current flowing through the gate.

Figure 1B:
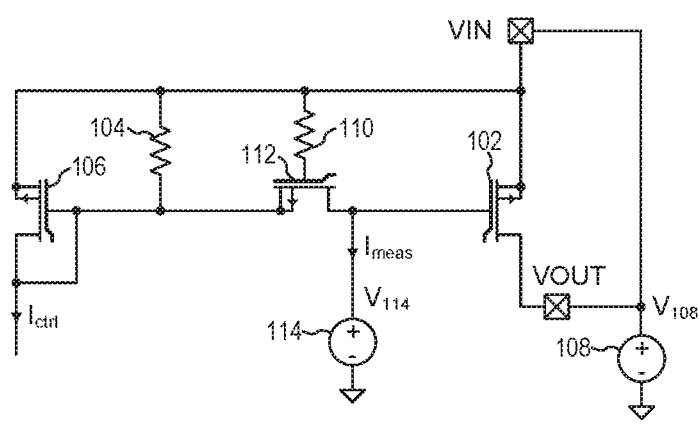
FIG. 1b shows the circuit of FIG. 1a including leakage stress test circuitry.

Test circuitry may be included to allow for leakage stress testing of the circuit of FIG. 1a. FIG. 1b shows the circuit of FIG. 1a including leakage stress test circuitry that is represented by normally-off transistor 112, resistor 110, and voltage sources 108 and 114. During leakage stress testing, polarization current $I_{ctrl}$ is off, and stress voltage $V_{108}$ is applied to the source and drain of power MOSFET 102. Resistor 110 pulls up a gate of normally-off transistor 112, keeping it off. Stress voltage $V_{114}$ is applied to the gate of power MOSFET 102, and current $I_{meas}$ is measured and compared with a predetermined threshold. Since normally-off transistor 112 is off during leakage stress testing, the presence of resistor 104 may have no substantial effect in current $I_{meas}$.

Figure 1C:
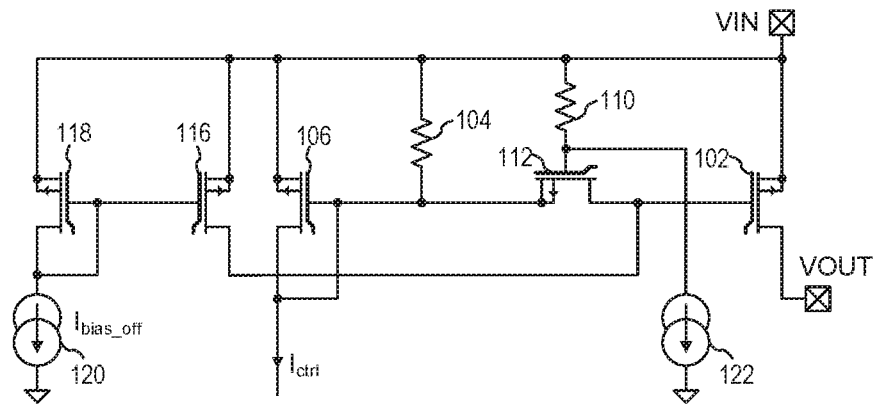
FIG. 1c shows the circuit of FIG. 1a including leakage stress test circuitry and additional circuitry to allow for normal operation.

It is often desirable for the leakage stress test circuitry to have no substantial effect during normal operation. FIG. 1c shows the circuit of FIG. 1a including leakage stress test circuitry and additional circuitry to allow for normal operation. During leakage stress testing, the circuit of FIG. 1c can be made to behave in a similar manner as the circuit of FIG. 1b by turning off bias current 122 and polarization current $I_{ctrl}$, connecting source and drain of power MOSFET 102 to stress voltage $V_{108}$, and connecting stress voltage $V_{114}$ to the gate of power MOSFET 102. During normal operation, bias current 122 pulls down the gate of normally-off transistor 112 to turn on normally-off transistor 112 to allow for polarization current $I_{ctrl}$ to be mirrored into power MOSFET 102. During a power-down state, normally-off transistor 112 and polarization current $I_{ctrl}$ are off. Bias current $I_{bias\_off}$ flowing through transistor 118 is used to mirror it into transistor 116 to pull the gate of power MOSFET 102 up to turn power MOSFET 102 off.

Figure 1D:
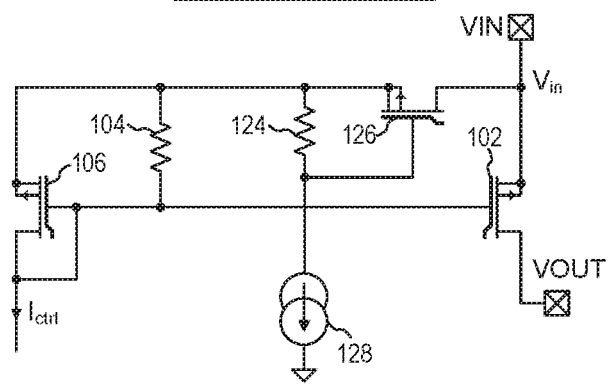

Other implementations of test circuitry for leakage stress testing of the circuit of FIG. 1a have been tried in the past. FIG. 1d shows another implementation of leakage stress test circuitry of the circuit of FIG. 1a. As shown in FIG. 1d, normally-off transistor 126 is placed in series with terminal VIN. During leakage stress testing, normally-off transistor 126 may be configured to prevent the current from resistor 104 from affecting the current leakage measurement. The circuit of FIG. 1d can be made to behave in a similar manner as the circuit of FIG. 1b by turning off bias current 128 and polarization current $I_{ctrl}$, connecting source and drain of power MOSFET 102 to stress voltage $V_{108}$, and connecting stress voltage $V_{114}$ to the gate of power MOSFET 102. During normal operation, bias current 128 pulls down the gate of normally-off transistor 126 turning it on. During the power down state, bias current 128 is kept on to fully turn off normally-off transistor 126.

Figure 2A:
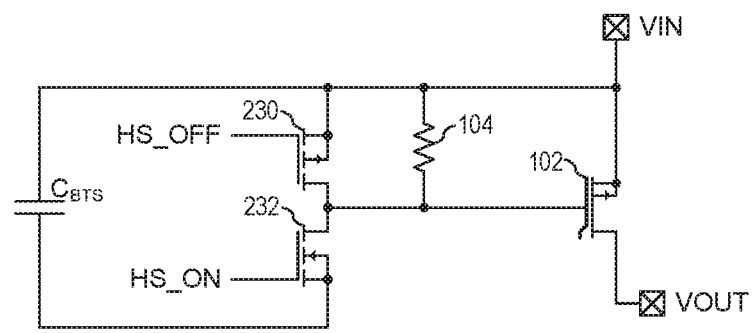
FIG. 2a shows a power MOSFET system in a topology that could be used in a high-side driver.
Figure 2B:
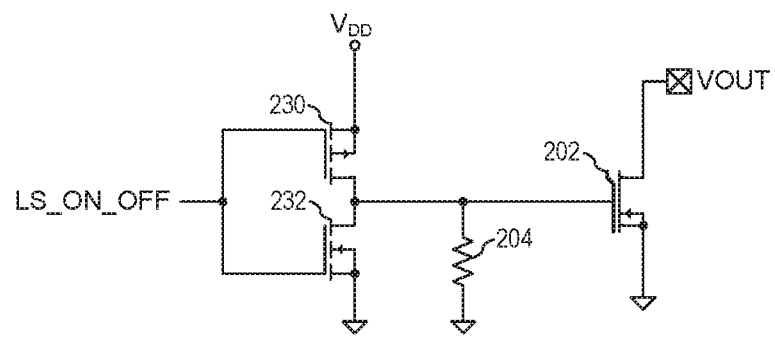
FIG. 2b shows a power MOSFET system in a topology that could be used in a low-side driver.

Power MOSFETs implementations in other topologies may also implement leakage stress testing during production. FIGS. 2a and 2b show power MOSFETs with other gate drive circuit topologies. FIG. 2a shows a power MOSFET with a gate drive circuit topology typical of a high-side driver. During normal operation, a gate drive circuit including transistor 230 and 232 control the gate of power MOSFET 102. The gate of power MOSFET 102 is pulled high when transistor 230 is on and transistor 232 is off, and is pulled low when transistor 230 is off and transistor 232 is on. Capacitor $C_{BTS}$ may be used as a bootstrap capacitor.

FIG. 2b shows a power MOSFET with a gate drive circuit topology typical of a low-side driver. During normal operation, a gate drive circuit including transistor 230 and 232 control the gate of power MOSFET 202. The gate of power MOSFET 202 is pulled high when transistor 230 is on and transistor 232 is off, and is pulled low when transistor 230 is off and transistor 232 is on.

In various embodiments, a gate leakage measurement is performed by isolating the current of the measured transistor from a driving circuit via a normally-on transistor. The normally-on transistor may be configured to remain on during normal operation and during a power-down state without extra current being consumed by test and/or support circuitry.

Certain types of transistors, such as depletion NMOS transistors, junction field effect transistor (JFETs) and gallium nitride (GaN) high electron mobility transistor (HEMT) behave as "normally-on" devices in that they are in a conductive state when zero volts is applied between the gate and source of the transistor. In order to switch these transistors off, a sufficiently high negative gate voltage is applied between the gate and the source of the transistor. For example, in the case of a GaN HEMT, this reverse voltage may be between about −5 V and about −8 V; however, turn off voltages outside of this range may also occur in some devices.

In an embodiment power-down state, active devices may be turned-off or operated using reduced power. For example, power MOSFET 102 is shut off in a power-down state by coupling the gate and source of power MOSFET 102 together via resistor 104 and the load path of normally-on transistor 302.

FIGS. 3a-3d show power MOSFET system 300 according to an embodiment of the present invention. Power MOSFET system 300 includes a power MOSFET, a gate drive circuit configured to control the gate of the power MOSFET, and a normally-on transistor configured to prevent the flow of current between the drive circuit and the gate of the power MOSFET during leakage stress testing. The additional leakage stress test circuitry may not require additional current during normal operation and during a power-down state.

Figure 3A:
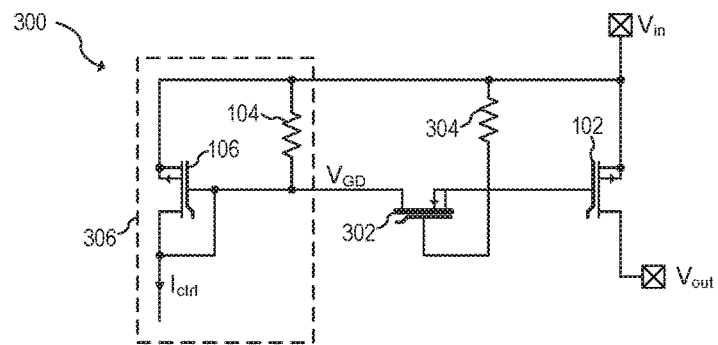
FIG. 3a shows a high level circuit schematic of a power MOSFET system in a topology that could be used in a linear voltage regulator implementing a normally-on transistor of the n-type between the gate drive circuit and the power MOSFET gate, according to an embodiment of the present invention.

FIG. 3a shows a high level circuit schematic of power MOSFET system 300, according to an embodiment of the present invention. Power MOSFET system 300 has a topology that could be used in a linear voltage regulator and includes gate drive circuit 306, normally-on transistor 302, pull-up resistor 304, and power MOSFET 102. Gate drive circuit 306 includes transistor 106 and pull-up resistor 104.

During normal operation, pull-up resistor 304 pulls-up a gate of normally-on transistor 302 to a voltage greater or equal to the threshold voltage of normally-on transistor 302, keeping normally-on transistor 302 on. Some embodiments pull up the gate of normally-on transistor 302 to terminal VIN. Alternatively, other nodes or voltage references may be used. Gate drive circuit 306 may control a gate of power MOSFET 102, for example, by mirroring polarization current $I_{ctrl}$ flowing through transistor 106 into a current flowing through a load path of power MOSFET 102.

During a power-down state, even though the gate-to-source voltage ($V_{gs}$) of normally-on transistor 302 may be zero, normally-on transistor remains on allowing current to flow through the load path of normally-on transistor 302. Resistor 104, therefore, may keep power MOSFET 102 off by keeping the $V_{gs}$ of power MOSFET 102 near zero.

Power MOSFET 102 may be a normally-off, p-type transistor. In embodiments of the present invention, power MOSFET 102 may be implemented using transistors of the n-type or p-type, normally-on or normally-off transistors, and high voltage transistors or low voltage transistors, including, but not limited to MOSFETs, power MOSFETs, JFETs, HEMT such as GaN HEMTs, and insulated gate bipolar transistors (IGBTs). Alternatively, other transistor types may be used. The selection of which transistor to use may be made according to the specifications and voltage levels of the particular system being designed and appropriate adjustments to the circuit may be made to accommodate the particular device type. Power MOSFET 102 may be inside an integrated circuit or, alternatively, may be a component external to an integrated circuit.

Normally-on transistor 302 may be a depletion NMOS transistor. In embodiments of the present invention, power MOSFET 102 may be implemented using transistors of the n-type or p-type including, but not limited to, depletion MOSFETs, JFETs, HEMT such as GaN HEMTs, and IGBTs. Alternatively, other normally-on transistor types may be used. The selection of which transistor to use may be made according to the specifications of the particular system being designed and appropriate adjustments to the circuit may be made to accommodate the particular device type. Power MOSFET 102 may be inside an integrated circuit or, alternatively, may be a component external to an integrated circuit.

Gate drive circuit 306 is coupled to a gate terminal of power MOSFET 102 and is capable of applying voltage $V_{GD}$ to the gate of power MOSFET 102 to turn on or off power MOSFET 102 depending on voltage $V_{GD}$ value. Voltage $V_{GD}$ may be selected to operate power MOSFET 102 in the linear region. Alternatively, voltage $V_{GD}$ may switch on and off, for example, at a frequency of 100 kHz. Other frequencies may also be used.

Gate drive circuit 306 may be implemented with transistor 106 and resistor 104. Transistor 106 may be in a current mirror configuration to copy a scaled version of polarization current $I_{ctrl}$ into power MOSFET 102. Resistor 104 may have a resistance value of 100 kΩ and may be configured to keep power MOSFET 102 off during the power-down state. Other resistance values for resistor 104 may be used. Alternatively, other pull-up mechanisms known in the art may be used, such as current generators based on MOS and BJT transistors.

Embodiments that implement a normally-on transistor to prevent the flow of current from the gate drive circuit and into the gate of a power MOSFET during a leakage stress test may have many advantages. For example, embodiments may not require additional current during normal operation or during a power-down state. Also, no additional circuitry to allow for correct behavior during normal operation and the power down state may be required.

Figure 3B:
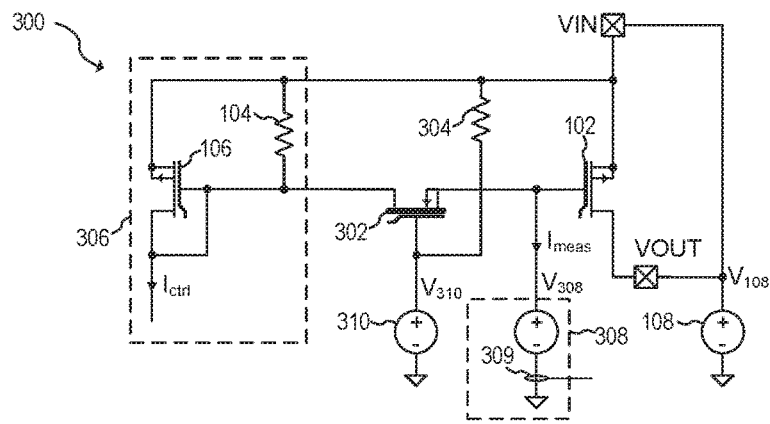
FIG. 3b shows a high level circuit schematic of a power MOSFET system in a leakage stress test configuration, according to an embodiment of the present invention.

FIG. 3b shows a high level circuit schematic of power MOSFET system 300 in a leakage stress test configuration, according to an embodiment of the present invention. During a leakage stress test, normally-on transistor 302 is turned off to prevent currents from gate drive circuit 306 to influence current $I_{meas}$. Power supply 108 may apply stress voltage $V_{108}$, for example, at 8 V, to the source and drain of power MOSFET 102, and circuit 308 may apply stress voltage $V_{308}$, for example, at 2 V, to the gate of power MOSFET 102. Other values for stress voltages $V_{108}$ and $V_{308}$ may be used. The total voltage stress $V_{stress}$ applied to power MOSFET 102 is given by $$V_{stress} = V_{108} - V_{308} \qquad (1)$$

Power supply 310 is configured to apply voltage $V_{310}$ to the gate of normally-on transistor 302 to ensure that normally-on transistor 302 is off during the leakage stress test. Voltage $V_{310}$ may be, for example, 0 V, which in combination with voltage $V_{310}$ being at, for example, 2 V, would cause the $V_{gs}$ of normally-on transistor 302 to be −2 V. Other voltages may be used. Power supply 310 may be a charge pump, regulator, or any other voltage source known in the art. Power supply 310 may be inside an integrated circuit including power MOSFET 102, may be a discrete component inside power MOSFET system 300, or may be a voltage supplied externally. Some embodiments may supply voltage $V_{310}$ from an automatic test equipment (ATE) or from an external power supply.

Power supply 108 is configured to apply voltage $V_{108}$ to the source and drain of power MOSFET 102. Voltage $V_{108}$ may be 8 V. Other voltages may be used. Power supply 108 may be a charge pump, regulator, or any other voltage source known in the art. Power supply 108 may be inside an integrated circuit including power MOSFET 102, may be a discrete component inside power MOSFET system 300, or may be a voltage supplied externally. Some embodiments may supply voltage $V_{108}$ from an automatic test equipment (ATE) or from an external power supply.

Circuit 308 may be configured to apply voltage $V_{308}$ to the gate of power MOSFET 102 while measuring current $I_{meas}$. Current $I_{meas}$ may be measured by circuit 309 in any way known in the art. For example, circuit 309 may include a resistor of a known resistance and a voltage measurement circuit configured to measure the voltage drop created by current $I_{meas}$ across the known resistor. Voltage $V_{308}$ may be 2 V. Other voltages may be used. Circuit 108 may include a charge pump, regulator, or any other voltage source known in the art, and may include a circuit for measuring current $I_{meas}$. Circuit 308 may be inside an integrated circuit including power MOSFET 102, may be a discrete component inside power MOSFET system 300, or may be a voltage supplied externally. Some embodiments may supply voltage $V_{308}$ and measure current $I_{meas}$ using an automatic test equipment (ATE) or an external power supply and measurement equipment.

Embodiments of the present invention may implement leakage stress test circuitry in a small die area relative to the area of the overall power MOSFET. Smaller dies may have a lower number of defects than a larger die for a given defect density. A small increment in the overall area of a die may not have a substantial effect in increasing the probability of having a defect in such die.

Figure 3C:
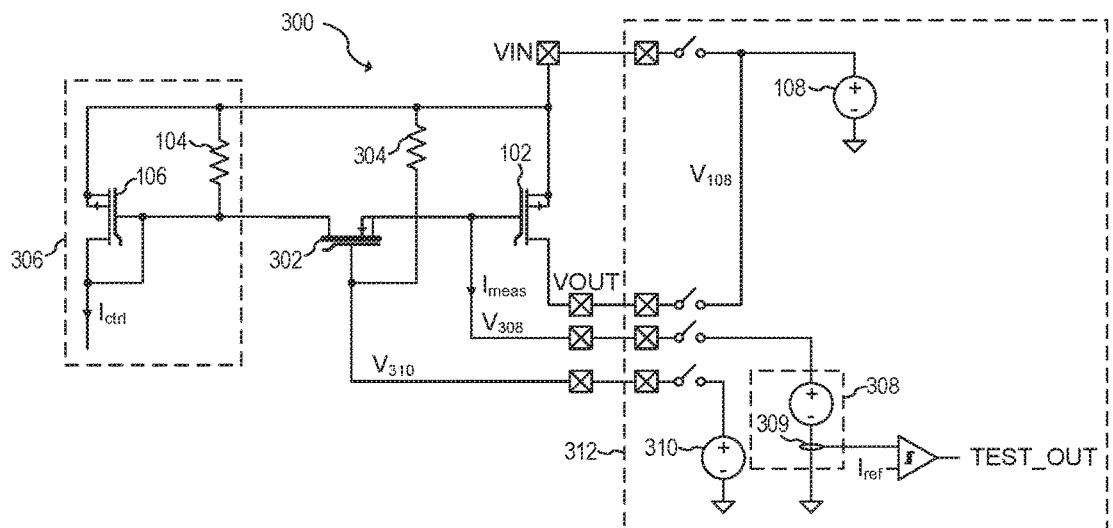
FIG. 3c shows a high level circuit schematic of a power MOSFET system in a leakage stress test configuration performed by an ATE, according to an embodiment of the present invention.

FIG. 3c shows a high level circuit schematic of power MOSFET system 300 in a leakage stress test configuration performed by an ATE, according to an embodiment of the present invention. As shown in FIG. 3c, ATE 312 may include power supply 310, power 108 and circuit 308 to provide voltage $V_{310}$, voltage $V_{108}$, and voltage $V_{308}$, and measure current $I_{meas}$. ATE 312 may also compare current $I_{meas}$ with reference current $I_{ref}$ to determine whether the gate leakage current of power MOSFET 102 is less than reference current $I_{ref}$. Comparing current $I_{meas}$ with reference current $I_{ref}$ may be implemented in hardware with, for example, a comparator. Alternatively, comparing current $I_{meas}$ with reference current $I_{ref}$ may be implemented in software or with a mixed signal approach. For example, current $I_{meas}$ may be converted into a digital form by using an analog-to-digital converter (ADC) and processed digitally. In such cases, the value of reference current $I_{ref}$ may be stored in a register or other storage media.

Figure 3D:
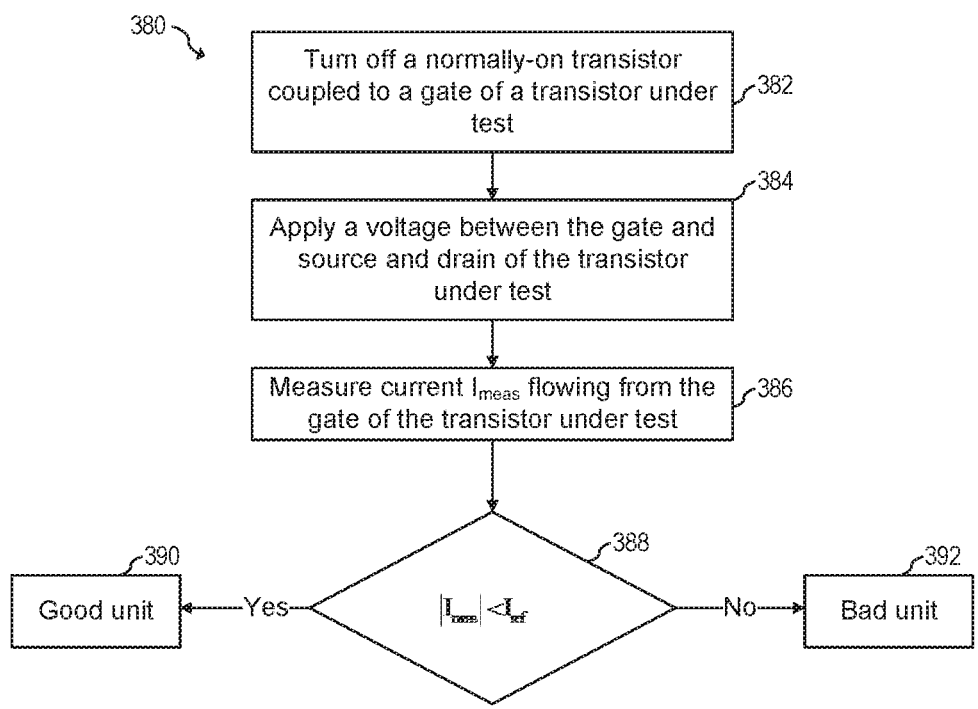
FIG. 3d illustrates a flow chart of embodiment method for performing a leakage stress test to a power MOSFET system.

FIG. 3d illustrates a flow chart of embodiment method 380 for performing a leakage stress test to a power MOSFET system. Method 380 may be implemented in power MOSFET system 300, but it may also be implemented in other circuit architectures and in other ways known in the art. Method 380 may be implemented with an ATE or other external equipment, with circuitry inside the power MOSFET system, or with a combination thereof. The discussion that follows assumes that power MOSFET system 300, as shown in FIGS. 3a-3c implement method 380 for performing a leakage stress test.

Step 382 turns off a normally-on transistor, such as normally-on transistor 302, coupled to a gate of a transistor under test, such as power MOSFET 102, to prevent currents from other circuits coupled to the gate of the transistor under test, such as gate drive circuit 306, from affecting the leakage stress current, such as current $I_{meas}$. Turning off the normally-on transistor may be done by, for example, power supply 310.

Step 384 applies a stress voltage between the gate of the transistor under test and the source and drain of the transistor under test. The stress voltage applied may be positive or negative. The stress voltage may be applied by, for example, circuit 308 and power supply 108. Step 384 may also occur before or at the same moment of step 382.

Step 386 measures the leakage stress current. The current measurement may be implemented by letting the leakage stress current go through a known resistor and measuring the voltage across the known resistor. Other methods known in the art to measure current may be applied.

Step 388 compares the leakage stress current to a reference current to determine if there are defects in the transistor under test. If the leakage stress current is lower than the reference current, the transistor under test may not have defects typically reflected in the leakage stress test and may be categorized in step 390 as a good unit. Otherwise, if the leakage stress current is equal to or greater than the reference current, the transistor under test may have defects and may be categorized in step 392 as a bad unit. Since the leakage stress current direction may be different depending on whether the stress voltage applied in step 384 is positive or negative, step 388 uses the mathematical symbol of absolute value to denote that the magnitude of the leakage stress current is the parameter of interest.

Advantages of various embodiments of methods for performing a leakage stress test include that they may be performed by an ATE, but may also be performed by circuitry incorporated into an integrated device including a power MOSFET. Methods for performing a leakage stress test according to the present invention may also be implemented using discrete and custom circuits.

Figure 4A:
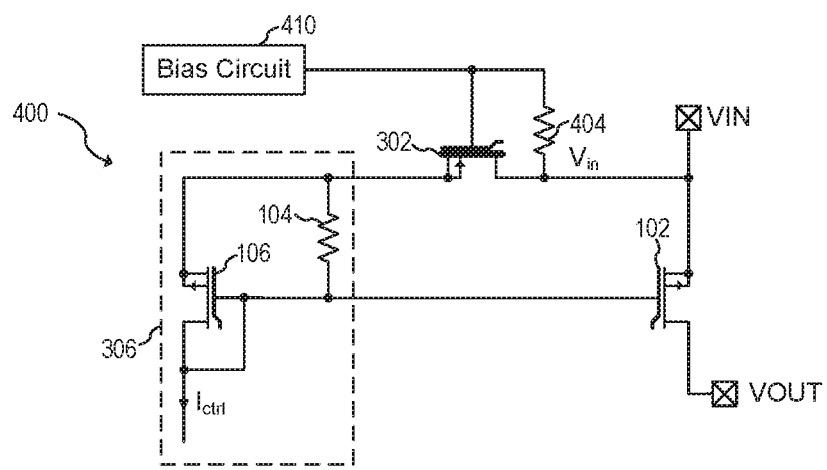
FIGS. 4a and 4b show a power MOSFET system in a topology that could be used in a linear voltage regulation implementing a normally-on transistor of the n-type between the gate drive circuit input and the power MOSFET input, according to another embodiment of the present invention.
Figure 4B:
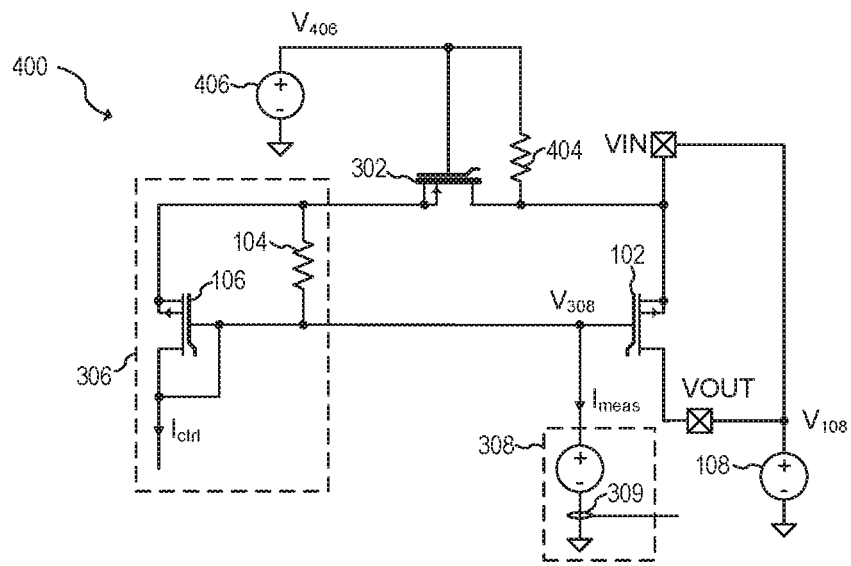

Embodiments of the present invention may prevent the flow of current from a gate drive circuit into the gate of a power MOSFET during a leakage stress test by implementing the normally-on transistor in different places of the power MOSFET system. FIGS. 4a and 4b show power MOSFET system 400 implementing a normally-on transistor of the n-type between the gate drive circuit input and the power MOSFET input, according to an embodiment of the present invention. Power MOSFET system 400 has a linear voltage regulator topology and includes gate drive circuit 306, normally-on transistor 302, pull-up resistor 404, extra bias circuit 410, and power MOSFET 102.

Power MOSFET system 400 may operate in a similar manner as power MOSFET system 300, and may implement method 380 for performing a leakage stress test. Power MOSFET 400, however, may use bias circuit 410 to ensure that the voltage drop across the load path of normally-on transistor 302 is small.

FIG. 4a shows a high level circuit schematic of power MOSFET system 400. During normal operation, pull-up resistor 404 pulls-up a gate of normally-on transistor 302, keeping normally-on transistor 302 on. Bias circuit 410 may be used to ensure that normally-on transistor 302 does not exhibit a substantial voltage drop across its load path. Gate drive circuit 306 may control a gate of power MOSFET 102, for example, by mirroring polarization current $I_{ctrl}$ flowing through transistor 106 into a current flowing through a load path of power MOSFET 102.

During the power-down state, normally-on transistor 302 remains on allowing current to flow through the load path of normally-on transistor 302. Bias circuit 410 may be off during the power-down state. Resistor 104, therefore, may keep power MOSFET 102 off by keeping the $V_{gs}$ of power MOSFET 102 near zero.

Bias circuit 410 may be used to decrease the $R_{DSon}$ of normally-on transistor 302. Bias circuit 410 may be implemented using a charge pump. Alternatively, it may be implemented using any other way known in the art.

FIG. 4b shows a high level circuit schematic of power MOSFET system 400 in a leakage stress test configuration, according to an embodiment of the present invention. During a leakage stress test, normally-on transistor 302 is turned off by applying voltage $V_{406}$ to the gate of normally-on transistor 302 to prevent currents from gate drive circuit 306 to influence current $I_{meas}$. Voltage $V_{406}$ may be 0 V, but other values could be used. Power supply 108 may apply stress voltage $V_{108}$, for example, at 8 V, to the source and drain of power MOSFET 102, and circuit 308 may apply stress voltage $V_{308}$, typically at 2 V, to the gate of power MOSFET 102. Polarization current $I_{ctrl}$ may be off during the leakage stress test.

Power supply 406 is configured to apply voltage $V_{406}$ to the gate of normally-on transistor 302 to ensure that normally-on transistor 302 is off during the leakage stress test. Voltage $V_{406}$ may be 0 V. Other voltages may be used. Power supply 406 may be a charge pump, regulator, or any other voltage source known in the art. Power supply 406 may be inside an integrated circuit including power MOSFET 102, may be a discrete component inside power MOSFET system 400, or may be a voltage supplied externally. Some embodiments may supply voltage $V_{406}$ from an automatic test equipment (ATE) or from an external power supply.

Figure 5A:
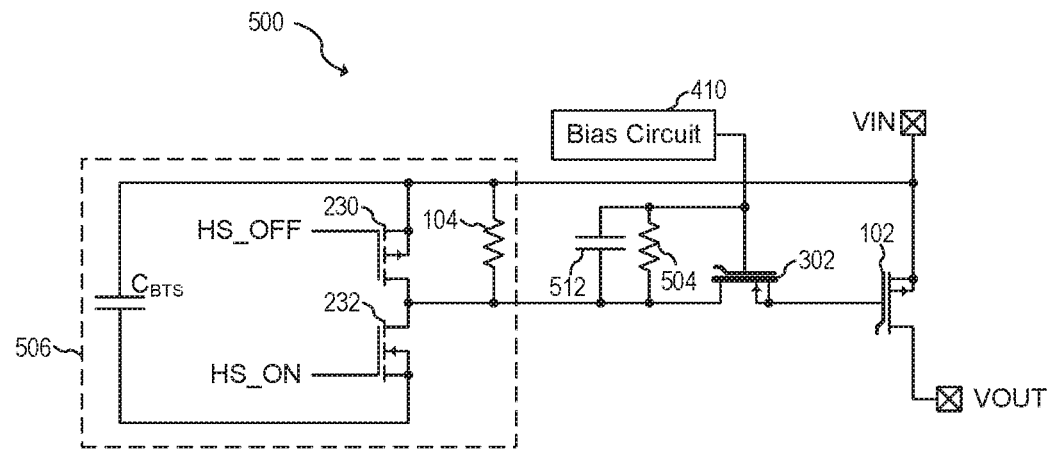
FIGS. 5a and 5b show a power MOSFET system in a topology that could be used in a high-side switch driver implementing a normally-on transistor of the n-type between the gate drive circuit and the power MOSFET gate, according to yet another embodiment of the present invention.
Figure 5B:
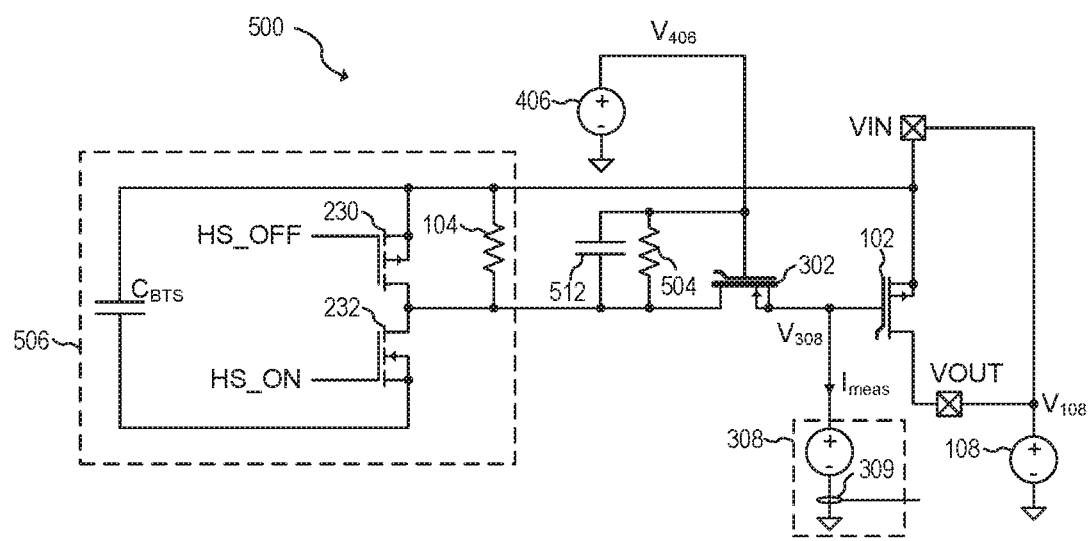

Embodiments of the present invention may also be implemented with various types of gate drive circuits. FIGS. 5a and 5b show power MOSFET system 500 with a gate drive circuit that may be used in a high-side switch configuration. Power MOSFET system 500 includes gate drive circuit 506, normally-on transistor 302, pull-up resistor 504, capacitor 512, extra bias circuit 510, and power MOSFET 102.

Power MOSFET system 500 may operate in a similar manner as power MOSFET system 300, and may implement method 380 for performing a leakage stress test. Power MOSFET system 500, however, may use transistor 230 and 232 instead of a polarization current to control the gate of power MOSFET 102.

FIG. 5a shows a high level circuit schematic of power MOSFET system 500. During normal operation, pull-up resistor 504 pulls-up a gate of normally-on transistor 302, keeping normally-on transistor 302 on. Bias circuit 410 may be used to ensure that normally-on transistor 302 does not exhibit a substantial voltage drop across its load path. Gate drive circuit 506 may control a gate of power MOSFET 102. Capacitor 512 may be used as a tank capacitor to keep normally-on transistor 302 on during fast transitions caused by gate drive circuit 506.

During an embodiment power-down state, normally-on transistor 302 remains on allowing current to flow through the load path of normally-on transistor 302. Bias circuit 410 may be off during the power-down state. Resistor 104, therefore, may keep power MOSFET 102 off by keeping the $V_{gs}$ of power MOSFET 102 near zero.

Gate drive circuit 506 may be implemented with transistors 230 and 232, and resistor 104. Transistors 230 and 232 may turn on or off in an out-of-phase way to turn on or off power MOSFET 102. For example, turning on transistor 230 and turning off transistor 232 may turn off power MOSFET 102. Turning off transistor 230 and turning on transistor 232 may turn on power MOSFET 102. Alternatively, transistors 230 and 232 may be switching on and off at a frequency, for example, of 100 kHz, to turn on and off power MOSFET 102 at the same frequency. Other frequencies may be used. Different modulation schemes, such as PWM, PFM, and other modulation schemes known in the art, may be used. Resistor 104 may be configured to keep power MOSFET 102 off during the power-down state.

FIG. 5b shows a high level circuit schematic of power MOSFET system 500 in a leakage stress test configuration, according to an embodiment of the present invention. During a leakage stress test, normally-on transistor 302 is turned off by applying voltage $V_{406}$ to the gate of normally-on transistor 302 to prevent currents from gate drive circuit 306 to influence current $I_{meas}$. Power supply 406 may apply voltage $V_{406}$, for example, at 0 V. Power supply 108 may apply stress voltage $V_{108}$, for example, at 8 V, to the source and drain of power MOSFET 102, and circuit 308 may apply stress voltage $V_{308}$, for example, at 2 V, to the gate of power MOSFET 102, and measure current $I_{meas}$.

Figure 6A:
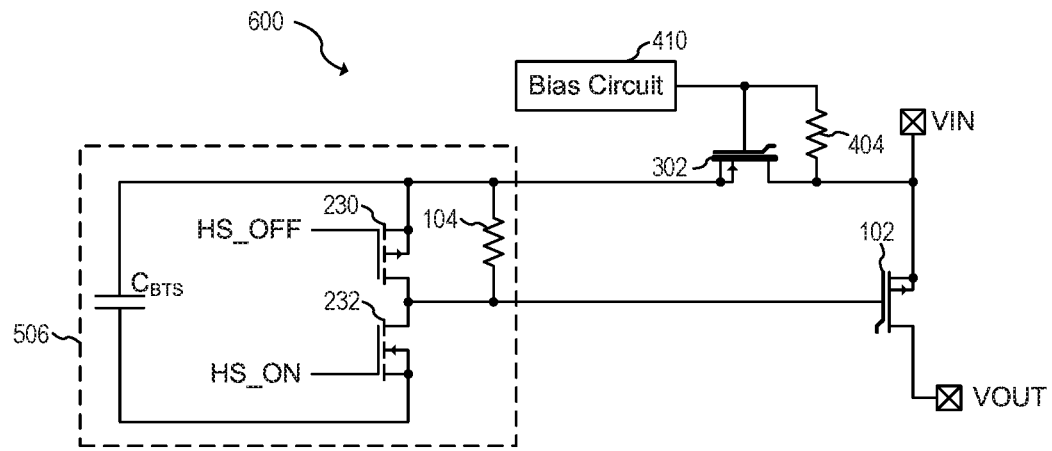
FIGS. 6a and 6b show a power MOSFET system in a topology that could be used in a high-side switch driver implementing a normally-on transistor of the n-type between the gate drive circuit input and the power MOSFET input, according to yet another embodiment of the present invention.
Figure 6B:
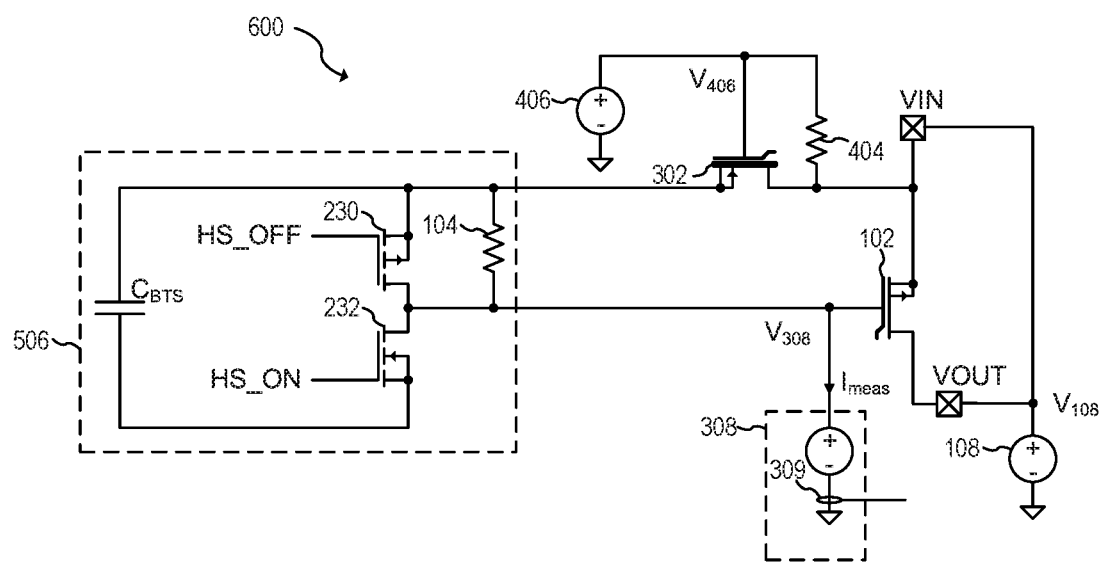

FIGS. 6a and 6b show power MOSFET system 600 implementing a normally-on transistor of the n-type between the gate drive circuit input and the power MOSFET input, where the gate drive circuit may be used in a high-side switch configuration, according to an embodiment of the present invention. Power MOSFET system 600 includes gate drive circuit 506, normally-on transistor 302, pull-up resistor 404, bias circuit 410, and power MOSFET 102.

Power MOSFET system 600 may operate in a similar manner as power MOSFET system 400, and may implement method 380 for performing a leakage stress test. Power MOSFET 600, however, may use transistor 230 and 232 instead of a polarization current to control the gate of power MOSFET 102.

FIG. 6a shows a high level circuit schematic of power MOSFET system 600. During normal operation, pull-up resistor 404 pulls-up a gate of normally-on transistor 302, keeping normally-on transistor 302 on. Bias circuit 410 may be used to ensure that normally-on transistor 302 does not exhibit a substantial voltage drop across its load path. Gate drive circuit 506 may control a gate of power MOSFET 102. During the power-down state, normally-on transistor 302 remains on allowing current to flow through the load path of normally-on transistor 302. Bias circuit 410 may be off during the power-down state. Resistor 104, therefore, may keep power MOSFET 102 off by keeping the $V_{gs}$ of power MOSFET 102 near zero.

FIG. 6b shows a high level circuit schematic of power MOSFET system 600 in a leakage stress test configuration, according to an embodiment of the present invention. During a leakage stress test, normally-on transistor 302 is turned off by applying voltage $V_{406}$, for example, at 0 V, to the gate of normally-on transistor 302 to prevent currents from gate drive circuit 506 to influence current $I_{meas}$. Voltage $V_{406}$ may be applied by power supply 406. Power supply 108 may apply stress voltage $V_{108}$, for example, at 8 V, to the source and drain of power MOSFET 102, and circuit 308 may apply stress voltage $V_{308}$, for example, at 2 V, to the gate of power MOSFET 102, and measure current $I_{meas}$. Other voltages may be used.

Figure 7A:
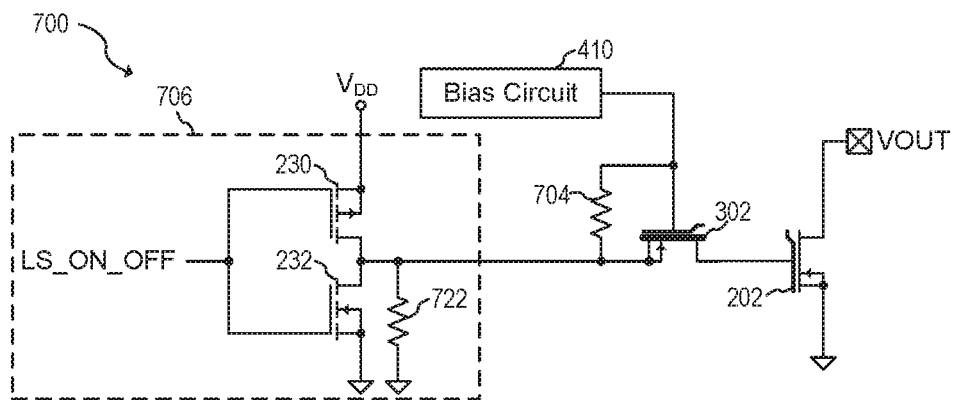
FIGS. 7a and 7b show a power MOSFET system in a topology that could be used in a low-side switch driver implementing a normally-on transistor of the n-type between the gate drive circuit and the power MOSFET gate, according to yet another embodiment of the present invention.
Figure 7B:
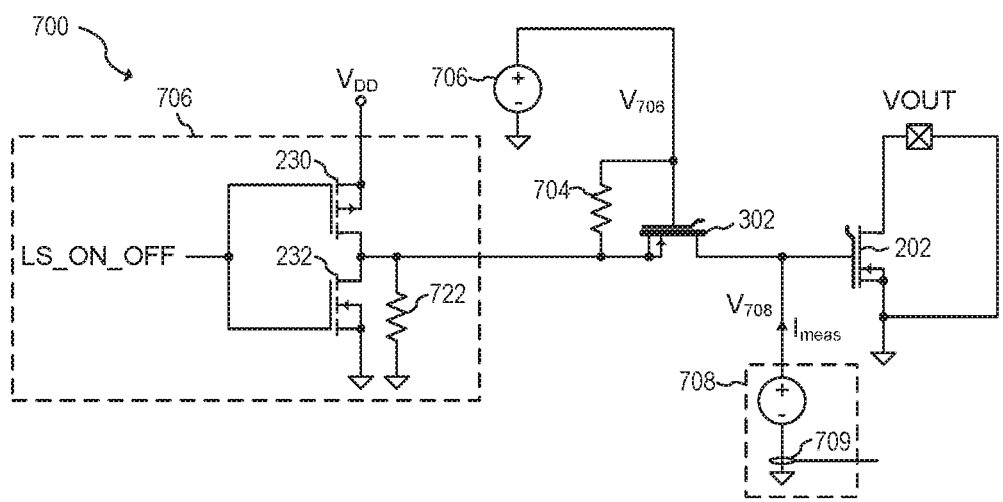

Embodiments of the present invention may also be implemented in low-side driver topologies. FIGS. 7a and 7b show power MOSFET system 700 with a gate drive circuit that may be used in a low-side switch configuration. Power MOSFET system 700 includes gate drive circuit 706, normally-on transistor 302, pull-up resistor 704, bias circuit 410, and power MOSFET 202. Gate drive circuit 706 includes transistors 230 and 232, and pull-down resistor 722.

FIG. 7a shows a high level circuit schematic of power MOSFET system 700. During normal operation, pull-up resistor 704 pulls-up a gate of normally-on transistor 302, keeping normally-on transistor 302 on. Bias circuit 410 may be used to ensure that normally-on transistor 302 does not exhibit a substantial voltage drop across its load path. Gate drive circuit 706 may control a gate of power MOSFET 102. During the power-down state, normally-on transistor 302 remains on allowing current to flow through the load path of normally-on transistor 302. Bias circuit 410 may be off during the power-down state. Resistor 722, therefore, may keep power MOSFET 202 off by keeping the $V_{gs}$ of power MOSFET 202 near zero.

FIG. 7b shows a high level circuit schematic of power MOSFET system 700 in a leakage stress test configuration, according to an embodiment of the present invention. During a leakage stress test, normally-on transistor 302 is turned off to prevent currents from gate drive circuit 706 to influence current $I_{meas}$. Normally-on transistor 302 may be turned off by applying voltage $V_{706}$, for example, at 0 V, to the gate of normally-on transistor 302 and by turning on transistor 230, which may create a negative Vgs at normally-on transistor 302. Voltage $V_{706}$ may be applied by power supply 706. The drain of power MOSFET 202 may be connected to the source of power MOSFET 202, and circuit 708 may apply stress voltage $V_{708}$, for example, at 6 V, to the gate of power MOSFET 202, and measure current $I_{meas}$.

Figure 8:
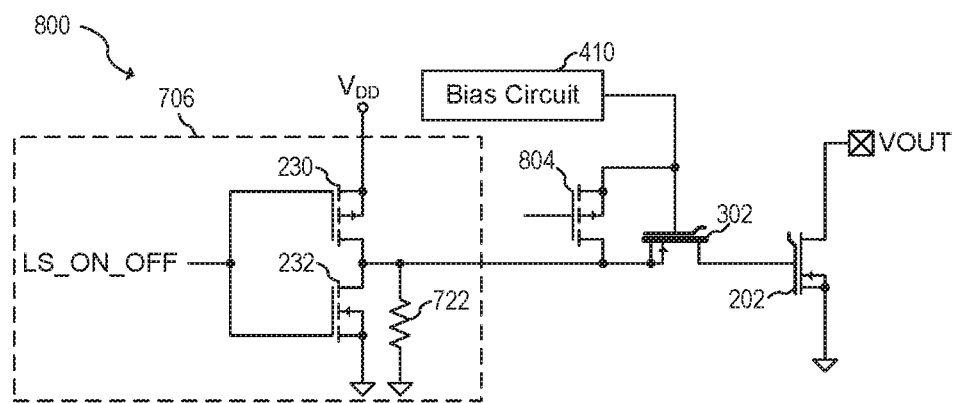
FIG. 8 shows a power MOSFET system implementing a pull-up element utilizing a transistor.

Embodiments of the present invention may implement a pull-up element configured to pull up a gate of a normally on transistor with components other than a resistor. FIG. 8 shows power MOSFET system 800 implementing a pull-up element utilizing a transistor. Power MOSFET system 800 includes gate drive circuit 706, normally-on transistor 302, pull-up transistor 804, bias circuit 410, and power MOSFET 202. Gate drive circuit 706 includes transistors 230 and 232, and pull-down resistor 722.

Power MOSFET system 800 may operate in a similar manner as power MOSFET system 700, and may implement method 380 for performing a leakage stress test. Power MOSFET 800, however, may use transistor 804 instead of resistor 704 to pull up the gate of normally-on transistor 302. Other pull-up elements known in the art may be used.

One general aspect includes a circuit including: a gate drive circuit; an output transistor having a first load path coupled between a supply node and an output node, and a gate coupled to the gate drive circuit; a normally-on transistor including a second load path coupled to the gate drive circuit and to the gate of the output transistor; and a pull-up device coupled between a gate of the normally-on transistor and a pull-up node, where the output transistor is configured to provide a test leakage current in a test mode when a measurement voltage is applied to a current test node coupled to the gate of the output transistor and a turn-off voltage is applied to the gate of the normally-on transistor; and the gate drive circuit is configured to provide a gate drive voltage to the gate of the output transistor in a nominal operation mode when a voltage of the gate of the normally-on transistor is pulled-up to a voltage of the pull-up node via the pull-up device.

Implementations may include one or more of the following features. The circuit where the pull-up device includes a resistor, and the normally-on transistor includes a depletion MOS transistor. The circuit where the depletion MOS transistor is an NMOS transistor. The circuit further including: a first voltage generator coupled to the a gate of the normally-on transistor, the first voltage generator configured to provide the turn-off voltage; and a second circuit coupled to the current test node, the second circuit including a second voltage generator configured to provide the measurement voltage, and a current measurement circuit configured to measure the test leakage current. The circuit where the first voltage generator provides the turn-off voltage while the second voltage generator provides the measurement voltage and the current measurement circuit measures the test leakage current. The circuit where the circuit is categorized as having a defect when the test leakage current is bigger than a reference current. The circuit where the first voltage generator and the second circuit are circuits of an automatic test equipment (ATE). The circuit where the first voltage generator and the second circuit are circuits of the same integrated circuit. The circuit where the test leakage current is negative, the turn-off voltage is negative, and the measurement voltage is zero. The circuit where the output transistor includes an NMOS transistor having a second source coupled to ground and a second drain; and the gate drive circuit includes a third transistor coupled to an output of the gate drive circuit, and a fourth transistor coupled to the output of the gate drive circuit. The circuit where the output transistor is a PMOS transistor; and the gate drive circuit includes a third transistor coupled to an output of the gate drive circuit, and a fourth transistor coupled to the output of the gate drive circuit. The circuit where the second load path is coupled between the gate drive circuit and the supply node of the output transistor; and the pull-up node includes the supply node. The circuit further including a bias circuit coupled to the gate of the normally-on transistor, where the second load path is coupled between the gate drive circuit and the gate of the output transistor. The circuit where the output transistor is a PMOS transistor; and the gate drive circuit includes a third transistor coupled to an output of the gate drive circuit, the third transistor configured to mirror a polarization current into the first load path. The circuit where the second load path is coupled between the gate drive circuit and a source of the output transistor; and the pull-up node includes the source of the output transistor. The circuit where the second load path is coupled between the gate drive circuit and the gate of the output transistor; and the pull-up node includes the supply node. The circuit where the gate drive circuit is configured to provide a gate drive voltage to the gate of the output transistor in a power-down state when a voltage of the gate of the normally-on transistor is pulled-up to the pull-up node via the pull-up device. The circuit where the pull-up device includes a transistor.

Another general aspect includes a method of operating a device including a first transistor, the method including: performing a leakage stress testing operation including preventing a current from flowing between a gate of the first transistor and a third circuit by turning off a normally-on transistor coupled to the gate of the first transistor and to the third circuit, applying a first stress voltage to the gate of the first transistor, and measuring a first current flowing from the gate of the first transistor; and performing a normal operation including turning on the normally-on transistor.

Implementations may include one or more of the following features. The method further including performing a power down operation including turning on the normally-on transistor. The method where the leakage stress testing operation further includes applying a second stress voltage to a source of the first transistor. The method where the source of the first transistor is coupled to a drain of the first transistor. The method where the third circuit controls the gate of the first transistor; applying the first stress voltage includes applying 8 V; and applying the second stress voltage includes applying 2 V. The method where the turning on the normally-on transistor includes pulling up a gate of the normally-on transistor to a pull-up node. The method where the pull-up node is coupled to a source of the normally-on transistor. The method where the turning on the normally-on transistor includes pulling up a gate of the normally-on transistor by a bias circuit. The method where the turning on the normally-on transistor includes pulling up a gate of the normally-on transistor to a source of the first transistor. The method further including categorizing the device as good if the first current is lower than a predetermined current, and categorizing the device as bad if the first current is higher than the predetermined current.

Yet another general aspect includes a circuit including: an integrated circuit including a first circuit, an output transistor having a first load path coupled between a supply node and an output node, and a gate coupled to the first circuit, a first test node coupled to the gate of the output transistor, a depletion NMOS transistor including a second load path coupled between the first circuit and the gate of the output transistor, a second test node coupled to a gate of the depletion NMOS transistor, and a pull-up element coupled between the gate of the depletion NMOS transistor and a pull-up node.

Implementations may include one or more of the following features. The circuit further including a first voltage generator coupled to the second test node and configured to provide a first stress voltage; a second voltage generator coupled to the first test node and configured to provide a measurement voltage; and a current measurement circuit coupled to the second voltage generator and configured to measure leakage current. The circuit where the pull-up element includes a transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
a gate drive circuit;
an output transistor having a first load path coupled between a supply node and an output node, and a gate coupled to the gate drive circuit;
a normally-on transistor comprising a second load path coupled to the gate drive circuit and to the gate of the output transistor; and
a pull-up device coupled between a gate of the normally-on transistor and a pull-up node, wherein
the output transistor is configured to provide a test leakage current in a test mode when a measurement voltage is applied to a current test node coupled to the gate of the output transistor and a turn-off voltage is applied to the gate of the normally-on transistor; and
the gate drive circuit is configured to provide a gate drive voltage to the gate of the output transistor in a nominal operation mode when a voltage of the gate of the normally-on transistor is pulled-up to a voltage of the pull-up node via the pull-up device.

2. The circuit of claim 1, wherein
the pull-up device comprises a resistor, and
the normally-on transistor comprises a depletion MOS transistor.

3. The circuit of claim 2, wherein the depletion MOS transistor is an NMOS transistor.

4. The circuit of claim 1, further comprising:
a first voltage generator coupled to the a gate of the normally-on transistor, the first voltage generator configured to provide the turn-off voltage; and
a second circuit coupled to the current test node, the second circuit comprising
a second voltage generator configured to provide the measurement voltage, and
a current measurement circuit configured to measure the test leakage current.

5. The circuit of claim 4, wherein the first voltage generator provides the turn-off voltage while the second voltage generator provides the measurement voltage and the current measurement circuit measures the test leakage current.

6. The circuit of claim 5, wherein the circuit is categorized as having a defect when the test leakage current is bigger than a reference current.

7. The circuit of claim 4, wherein the first voltage generator and the second circuit are circuits of an automatic test equipment (ATE).

8. The circuit of claim 4, wherein the first voltage generator and the second circuit are circuits of the same integrated circuit.

9. The circuit of claim 4, wherein
the test leakage current is negative,
the turn-off voltage is negative, and
the measurement voltage is zero.

10. The circuit of claim 1, wherein
the output transistor comprises an NMOS transistor having a second source coupled to ground and a second drain; and
the gate drive circuit comprises
a third transistor coupled to an output of the gate drive circuit, and
a fourth transistor coupled to the output of the gate drive circuit.

11. The circuit of claim 1, wherein
the output transistor is a PMOS transistor; and
the gate drive circuit comprises
a third transistor coupled to an output of the gate drive circuit, and
a fourth transistor coupled to the output of the gate drive circuit.

12. The circuit of claim 11, wherein
the second load path is coupled between the gate drive circuit and the supply node of the output transistor; and
the pull-up node comprises the supply node.

13. The circuit of claim 11, further comprising a bias circuit coupled to the gate of the normally-on transistor, wherein the second load path is coupled between the gate drive circuit and the gate of the output transistor.

14. The circuit of claim 1, wherein
the output transistor is a PMOS transistor; and the gate drive circuit comprises a third transistor coupled to an output of the gate drive circuit, the third transistor configured to mirror a polarization current into the first load path.

15. The circuit of claim 14, wherein
the second load path is coupled between the gate drive circuit and a source of the output transistor; and
the pull-up node comprises the source of the output transistor.

16. The circuit of claim 14, wherein the second load path is coupled between the gate drive circuit and the gate of the output transistor; and
the pull-up node comprises the supply node.

17. The circuit of claim 1, wherein the gate drive circuit is configured to provide a gate drive voltage to the gate of the output transistor in a power-down state when a voltage of the gate of the normally-on transistor is pulled-up to the pull-up node via the pull-up device.

18. The circuit of claim 1, wherein the pull-up device comprises a transistor.

19. A method of operating a device comprising a first transistor, the method comprising:
performing a leakage stress testing operation comprising
preventing a current from flowing between a gate of the first transistor and a third circuit by turning off a normally-on transistor coupled to the gate of the first transistor and to the third circuit,
applying a first stress voltage to the gate of the first transistor, and
measuring a first current flowing from the gate of the first transistor; and
performing, by the device, a normal operation comprising turning on the normally-on transistor.

20. The method of claim 19, further comprising performing a power down operation comprising turning on the normally-on transistor.

21. The method of claim 19, wherein the leakage stress testing operation further comprises applying a second stress voltage to a source of the first transistor.

22. The method of claim 21, wherein the source of the first transistor is coupled to a drain of the first transistor.

23. The method of claim 21, wherein
the third circuit controls the gate of the first transistor;
applying the first stress voltage comprises applying 8 V; and applying the second stress voltage comprises applying 2 V.

24. The method of claim 19, wherein the turning on the normally-on transistor comprises pulling up a gate of the normally-on transistor to a pull-up node.

25. The method of claim 24, wherein the pull-up node is coupled to a source of the normally-on transistor.

26. The method of claim 19, wherein the turning on the normally-on transistor comprises pulling up a gate of the normally-on transistor by a bias circuit.

27. The method of claim 19, wherein the turning on the normally-on transistor comprises pulling up a gate of the normally-on transistor to a source of the first transistor.

28. The method of claim 19, further comprising categorizing the device as good if the first current is lower than a predetermined current, and categorizing the device as bad if the first current is higher than the predetermined current.

29. A circuit comprising:
an integrated circuit comprising
a first circuit,
an output transistor having a first load path coupled between a supply node and an output node, and a gate coupled to the first circuit,
a first test node coupled to the gate of the output transistor,
a depletion NMOS transistor comprising a second load path coupled between the first circuit and the gate of the output transistor,
a second test node coupled to a gate of the depletion NMOS transistor, and
a pull-up element coupled between the gate of the depletion NMOS transistor and a pull-up node.

30. The circuit of claim 29, further comprising
a first voltage generator coupled to the second test node and configured to provide a first stress voltage;
a second voltage generator coupled to the first test node and configured to provide a measurement voltage; and
a current measurement circuit coupled to the second voltage generator and configured to measure leakage current.

31. The circuit of claim 29, wherein the pull-up element comprises a transistor.

* * * * *